United States Patent [19]

Morgan

[11] 4,249,127
[45] Feb. 3, 1981

[54] STANDING WAVE RATIO MEASURING SYSTEM

[75] Inventor: Daniel G. Morgan, Wolfeboro, N.H.

[73] Assignee: Tram/Diamond Corporation, Winnisquam, N.H.

[21] Appl. No.: 966,352

[22] Filed: Dec. 4, 1978

[51] Int. Cl.³ .................................................. G01R 27/00
[52] U.S. Cl. .............................. 324/57 R; 324/58 R; 324/58 B
[58] Field of Search ............... 324/58 R, 58 B, 57 R, 324/95; 325/67, 133, 363

[56] References Cited

U.S. PATENT DOCUMENTS

| | | | |
|---|---|---|---|
| 2,961,605 | 11/1960 | Broadhead, Jr. | 324/95 X |
| 3,555,415 | 1/1971 | Shoemaker et al. | 324/57 R |
| 3,683,274 | 8/1972 | Martin | 324/58 R |
| 3,704,409 | 11/1972 | Oomen | 324/57 R |
| 4,096,441 | 6/1978 | Schwartz | 324/58 B X |
| 4,110,685 | 8/1978 | Leenerts | 324/57 R |
| 4,125,809 | 11/1978 | Mott | 324/57 R X |

Primary Examiner—Stanley T. Krawczewicz
Attorney, Agent, or Firm—Thomas N. Tarrant

[57] ABSTRACT

Digitally-controlled tracking impedances and an automatic standing wave ratio measuring instrument employing digitally-controlled tracking impedances to cause a voltage representing the forward voltage in a radio frequency transmission system to track a fixed voltage and to output a voltage with which the standing wave ratio can be directly displayed independently of the power characteristics of the transmission system.

6 Claims, 1 Drawing Figure

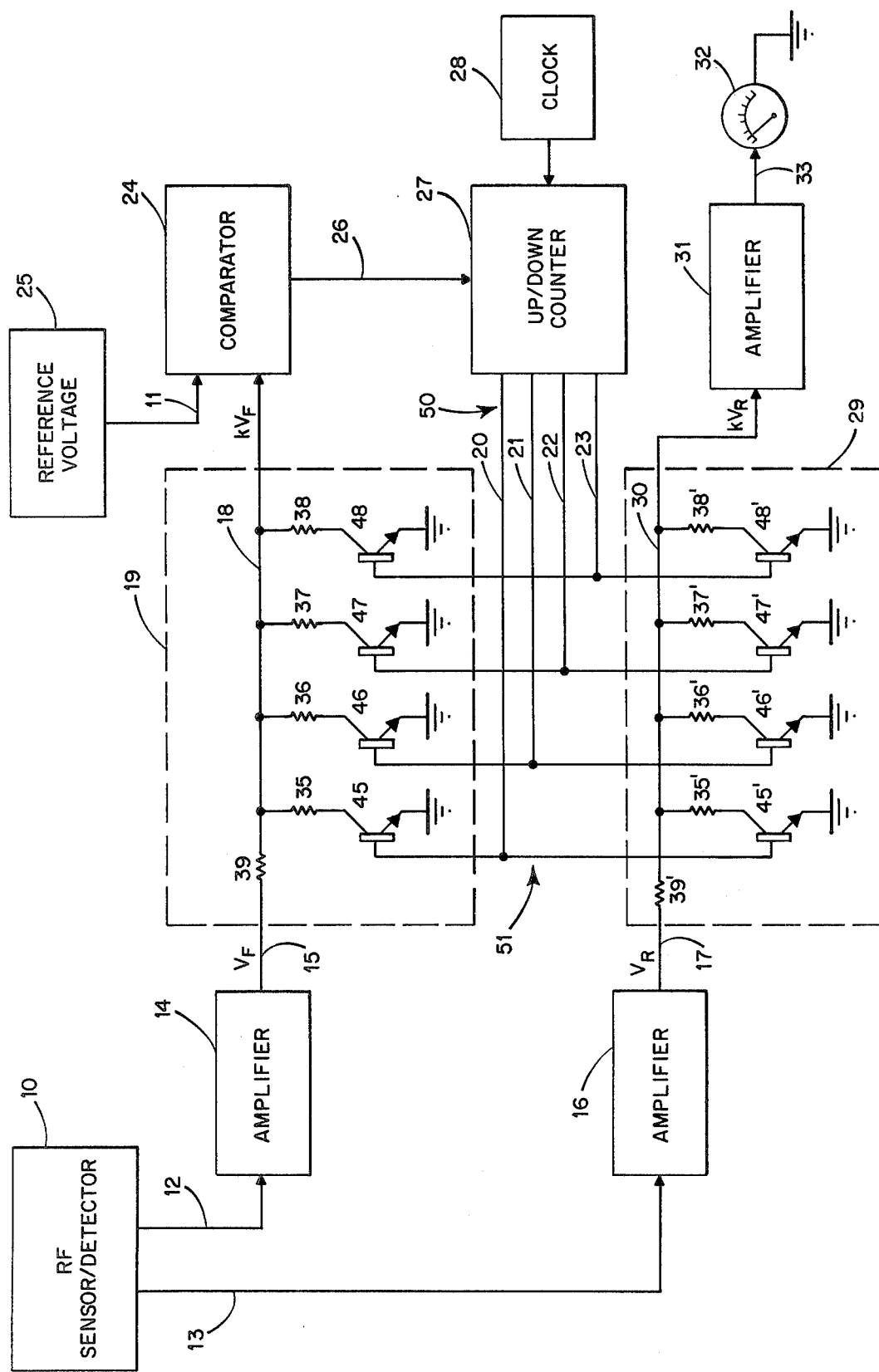

STANDING WAVE RATIO MEASURING SYSTEM

BACKGROUND OF THE INVENTION

1. Field of the Invention

This invention relates to digitally-controlled tracking impedances and to standing wave ratio measuring instruments and, more particularly, to those instruments which indicate the standing wave ratio without the need for manual calibration to a reference power level.

2. Description of the Prior Art

The condition of an RF transmission system is indicated by the standing wave ratio (SWR) as determined by the impedance match between the antenna and the transmission line. As the transmitter power in an RF transmission system is varied, the magnitudes of the forward voltage and the reverse (or reflected) voltage are subject to vary. As the impedance match is altered, the magnitude of the reverse voltage is subject to vary. It would be desirable to have a meter which is capable of continuously measuring the standing wave ratio of an RF transmission system without the need for recalibration caused by changing power and/or impedance characteristics. Various analog approaches have been suggested to provide such a meter as disclosed, for example in "A Simple Computing SWR Meter" by D. L. Fayman, QST, July 1973, or in U.S. Pat. No. 3,683,274. A combination digital and analog approach has been proposed in U.S. Pat. No. 3,704,409 to produce a digital indication of the ratio of the reflected voltage to the forward voltage; however, such an indication is not readily useful as an indicator of the standing wave ratio.

SUMMARY OF THE INVENTION

In accordance with one aspect of the present invention, a standing wave ratio measuring instrument is provided comprising first tracking impedance means for adjusting the degree of attenuation of a forward voltage having an attenuated forward voltage at an output and having a control signal input and a voltage input, the forward voltage being proportional to the magnitude of forward voltage in an RF transmission system; a reference voltage source having a reference voltage at an output; comparator means connected to the output of the first tracking impedance means and to the output of the reference voltage source for comparing the attenuated forward voltage with the reference voltage and for producing a control signal at an output in response thereto; a register having an input connected to the output of the comparator means and having a digital control signal output as an output whereby the first tracking impedance means is controlled to cause the attenuated forward voltage to track the reference voltage; second tracking impedance means for adjusting the degree of attenuation of a reverse voltage in linear correspondence with the degree of attenuation produced by the first tracking impedance means having an attenuated reverse voltage at an output and having a control signal input and a voltage input, the reverse voltage being proportional to the magnitude of reverse voltage in the RF transmission system; connection means to connect the control signal inputs of both the first and second tracking impedance means to the same digital control signal output of the register; and output means having an input connected to the output of the second tracking impedance means for producing a representation of the standing wave ratio of the RF transmission system.

In another aspect of the invention, a digitally-controlled tracking impedance network is provided comprising: a first tracking impedance with an input, an output, and a first control signal input; a second tracking impedance with a input, an output, and a second control signal input; a register having a control signal output for producing a digital control signal; and connection means to connect the control signal output to both the first control signal input and the second control signal input.

An object of the invention accordingly is to provide a novel automatic standing wave ratio measuring instrument which self-compensates for variations in output power characteristics using digitally-controlled tracking impedance networks.

Other objects and features of the invention will become apparent upon reading the following description in conjunction with the drawing.

BRIEF DESCRIPTION OF THE DRAWING

The drawing is a block diagram representation of a preferred embodiment of the present invention.

DESCRIPTION OF THE PREFERRED EMBODIMENT

The RF sensor/detector 10 has a directional coupler which permits simultaneous monitoring of the signal flow in both directions along an RF transmission line; the use of these devices is known to the art as shown in "An Inside Picture of Directional Wattmeters" by Warren B. Bruene, QST, April, 1959, and "In-Line RF Power Metering" by Doug Demaw, QST, Dec. 1969. A detected signal proportional to the forward voltage is produced at output 12 and is the input to amplifier 14 with a d.c. voltage proportional to the forward voltage, $V_F$, produced at terminal 15 of amplifier 14. Similarly, the RF sensor/detector produces a detected signal proportional to the reverse (or reflected) voltage at output 13 which is amplified in amplifier 16 with a d.c. voltage proportional to the reverse voltage, $V_R$, produced at terminal 17.

Tracking impedance 19 is placed between terminal 15 and line 18. Resistor 39 is placed in series between terminal 15 and line 18. Resistors 35, 36, 37 and 38 are arranged in parallel from line 18 to ground through switches 45, 46, 47 and 48 respectively. These switches may suitably be comprised of conventional semiconductor switches. Tracking impedance 19 acts as a voltage divider. The degree of attenuation depends on the status of switches 35 through 38 which are controlled by digital control signal output 50, the parallel digital code output of up/down counter 27 at outputs 20, 21, 22, and 23. The output impedance of amplifier 14 is low and the input impedance of comparator 24 is high in relation to the resistors used in tracking impedance 19 so that their effects on the attenuation are negligible.

The attenuated forward voltage appears at line 18 and equals the product $kV_F$ where k is the factor of attenuation produced by tracking impedance 19. $kV_F$ is inputted into comparator 24 by line 18 along with a fixed reference voltage which is inputted at a different input from source 25 by line 11 and which should be less than the minimum value of $V_F$ for proper operation of the inventive embodiment. The output of comparator 24 is a control signal such as a single output of a flip-flop appearing at terminal 26 and is inputted into up/down counter 27 to control the count. Clock 28 is provided for the up/down counter. When $kV_F$ exceeds the fixed reference voltage at line 11, the control signal at terminal 26 causes up/down counter 27 to change digital control signal output 50 so that switches 45 through 48 will be switched as needed to decrease the value of k so that $kV_F$ will correspondingly decrease. When $kV_F$ is lower than the fixed reference voltage at line 11, the control signal at terminal 26 is opposite from that present in the previous situation and up/down counter 27 is accordingly instructed to cause k to increase so that $kV_F$ will correspondingly increase. Thus, $kV_F$ tracks the fixed reference voltage at line 11 and k is maintained inversely proportional to $V_F$.

Tracking impedance 29 is interposed between terminal 17 and line 30. In the preferred embodiment, tracking impedance 29 is identical to tracking impedance 19. Each switch 45', 46', 47' or 48' is controlled in the same manner as its representative counterpart switch 45, 46, 47 or 48 by virtue of common connections 51 among each switch, its counterpart, and the respective output from digital control signal output 50. Each of the resistors 39', 35', 36', 37' and 38' is equivalent to its counterpart 39, 35, 36, 37 and 38 respectively. The output impedance of amplifier 16 is low and the input impedance of amplifier 31 is high in relation to the resistors used in tracking impedance 29 so that their effects on the attenuation are negligible. The degree of attenuation provided by tracking impedance 29 could be varied in linear correspondence with that provided by tracking impedance 19 merely by varying all the resistance values of the resistors in tracking impedance 29 in the same proportion to the corresponding resistors in tracking impedance 19 without affecting the essential operation of the invention. Preferably, all of the resistors in tracking impedance 19 and 29 are precision resistors to assure maximum accuracy.

The voltage appearing at line 30 is the product $kV_R$ since the degree of attenuation provided by tracking impedance 29 is the same as that provided by tracking impedance 19, represented by the attenuation factor, k.

Meter 32 is an analog voltmeter. The input to meter 32 is a voltage appearing at line 33 which is proportional to $kV_R$. Amplifier 31 is provided primarily to supply adequate current to operate meter 32, although it may provide voltage amplification. Since k is inversely proportional to $V_F$, the resultant voltage at line 33 is proportional to $V_R$ divided by $V_F$ and, in terms of the SWR, it is proportional to the quantity $[SWR-1]$ divided by $[SWR+1]$. Thus, for each value of the voltage at line 33, there is only one corresponding value of the SWR. Meter 32 is thus readily calibrated in terms of the SWR of the RF transmission system.

It will now be appreciated that the value of the fixed reference voltage applied at line 11 of comparator 24 is also the maximum value of $kV_R$ which is inputted into amplifier 31, because the maximum value of $V_R$ is $V_F$.

While the invention has been described in relation to a specific embodiment, modifications will occur to those skilled in the art such as the use of other types of voltmeters to embody meter 32. Digital control signal output 50 may be created with other digital logic circuits employing, for example, serial information flow with a serial-to-parallel converter to operate the switches in tracking impedances 19 and 29. The number of switches and corresponding resistors in each tracking impedance may of course be varied, and the tracking impedance design may be varied so long as the degree of attenuation can be controlled by digital control output signal 50. All such modifications are considered to fall within the spirit and scope of the invention as defined in the appended claims except where expressly limited otherwise.

I claim:

1. A standing wave ratio measuring instrument comprising:
    (a) first tracking impedance means for adjusting the degree of attenuation of a forward voltage having an attenuated forward voltage at an output and having a control signal input and a voltage input, the forward voltage being proportional to the magnitude of forward voltage in a RF transmission system;
    (b) a reference voltage source having a reference voltage at an output;
    (c) comparator means connected to the output of the first tracking impedance means and to the output of the reference voltage source for comparing the attenuated forward voltage with the reference voltage and for producing a control signal at an output in response thereto;
    (d) a register having an input connected to the output of the comparator means and having a digital control signal output as an output whereby the first attenuator means is controlled to cause the attenuated forward voltage to track the reference voltage;
    (e) second tracking impedance means for adjusting the degree of attenuation of a reverse voltage in linear correspondence with the degree of attenuation produced by the first tracking impedance means having an attenuated reverse voltage at an output and having a control signal input and a voltage input, the reverse voltage being proportional to the magnitude of reverse voltage in the transmission system;
    (f) connection means to connect the control signal input of both the first and second tracking impedance means to the same digital control signal output of the register; and
    (g) output means having an input connected to the output of the second tracking impedance means for producing a representation of the standing wave ratio of the RF transmission system.

2. A standing wave ratio measuring instrument as claimed in claim 1 wherein the first and second tracking impedance means each comprise a resistive voltage-divider network having semiconductor switches controlled by the digital control signal output to switch resistors in or out of the network.

3. A standing wave ratio measuring instrument as claimed in claims 1 or 2 wherein the register comprises:
    (a) an up/down counter; and
    (b) a clock connected to the up/down counter.

4. A standing wave ratio measuring instrument as claimed in claim 1 or 2 wherein the output means comprise:
    (a) an analog voltmeter calibrated to indicate the standing wave ratio; and
    (b) amplifier means for producing a voltage signal proportional to the attenuated reverse voltage at an output which is connected to the input of the voltmeter.

5. A standing wave ratio measuring instrument as claimed in claim 3 wherein the output means comprise:

(a) an analog voltmeter calibrated to indicate the standing wave ratio; and
(b) amplifier means for producing a voltage signal proportional to the attenuated reverse voltage at an output which is connected to the input of the voltmeter.

6. A standing wave ratio measuring instrument as claimed in claim 1 further comprising:
(a) an RF sensor/detector having a first and a second output;
(b) first amplifier means having an input connected to the first output of the RF sensor/detector and having an output connected to the voltage input of the first tracking attenuator means for producing the forward voltage on its output; and
(c) second amplifier means having an input connected to the second output of the RF sensor/detector and having an output connected to the voltage input of the second tracking attenuator means for producing the reverse voltage on its utput.

* * * * *